March 20, 1962 J. A. HOERNI 3,025,589

METHOD OF MANUFACTURING SEMICONDUCTOR DEVICES

Filed May 1, 1959

INVENTOR.
JEAN A. HOERNI

BY

Lippincott & Ralls
ATTORNEYS

United States Patent Office 3,025,589

Patented Mar. 20, 1962

3,025,589

METHOD OF MANUFACTURING SEMICONDUCTOR DEVICES

Jean A. Hoerni, Los Altos, Calif., assignor, by mesne assignments, to Fairchild Camera and Instrument Corporation, Syosset, N.Y., a corporation of Delaware Filed May 1, 1959, Ser. No. 810,388

11 Claims. (Cl. 29—25.3)

The present invention relates to an improvement in the manufacture of semiconductor devices including transistors and to an improved transistor structure. More particularly, the invention relates, as to the method thereof, to the control of semiconductor diffusing and masking to the end of producing an improved diffusion transistor having fully protected junctions and maximized exposed surfaces for ohmic contact attachment.

Advancements in transistor technology have in part been directed to the production of very small sized transistor structures, inasmuch as minute semiconductor geometries are required for high frequency applications of transistors. While the well known point-contact transistor is adapted for high frequency work, yet certain limitations attach to this type of transistor and consequently junction transistors have been developed for use in the high frequency range. One type of junction transistor which is particularly well adapted for high frequency applications is the double-diffused silicon transistor, and although the present invention is adapted for use with other types of transistors it is with respect to double-diffused silicon transistors that the following description is referenced.

As regards the manufacture of double-diffused silicon transistors, and in fact any minute transistor structure, difficulty is encountered in providing a sufficient exposed area of the base material for attachment of an ohmic contact thereto. By maintaining the extremely small element dimensions required of the transistor, there results only a minute thickness of base material exposed between the base-collector junction and the emitter-base junction on a transistor surface. Conventional transistor utility requires the provision of electrical contacts to the individual transistor elements or portions, and thus it is necessary for the dimensions of the base portion to be made sufficient to attach such contacts. In certain instances this limitation upon the size of the base portion is highly undesirable, inasmuch as conventional manufacturing practices produce a base thickness in proportion to the exposed base width.

Another difficulty arising from the limited size necessary for transistors to suitably operate at very high frequencies is encountered in the difficulty of protecting the transistor junction. This is particularly noted in the attachment of electrical contacts to the transistor portions inasmuch as very minute variations in the placement of electrical conductors or ohmic contacts to the transistor may well result in electrically shorting of the transistor junction, whereby the transistor structure is unsuited for use and must be rejected. This latter problem is compounded by the necessity in high-frequency transistors of employing an ohmic contact which substantially entirely covers the exposed surface of each of the elements in order to minimize the spreading resistance thereof. Conventional plating methods are unsuited for the provision of such ohmic contacts to within fractions of a millimeter from the transistor junction, as is normally required for transistor structures capable of operating at very high frequencies. Not only is the problem of providing suitable ohmic contacts to the transistor portions a major one, but also the possible damage or other types of inadvertent electrical shorting of the transistor junctions during manufacturing processes is of major importance in limiting the number of rejects in any manufacturing process. Additionally, long range contamination of transistor junctions may be a cause of drifting and deteriorization of transistor characteristics.

There have been developed for high frequency applications transistors of the "mesa" design wherein undesirable lateral extensions of the base-collector junction are removed by etching to produce transistors of very small dimensions. Although mesa transistors have found wide acceptance in the art, the junction exposed by the etching, as well as the other junction, is particularly vulnerable to contamination or degradation during subsequent portions of the manufacturing process. In accordance with the present invention there is produced a transistor having the minute dimensions of the mesa type, but with the unit at all times completely embedded in the semiconductor. In the process hereof, the transistor junctions are at all times fully protected by an oxide layer or coating formed simultaneously with the junction during diffusion at high temperatures so that no contamination of the transistor junctions during or after manufacture is possible. In this manner one of the major causes of transistor failure is entirely precluded.

The present invention provides a method of transistor manufacture overcoming the above-noted problems as well as others prevalent in the art. In the manufacture of transistors it is not uncommon for the semiconducting material to become oxidized on the exterior surfaces thereof, and it is conventional during manufacture to remove this outside coating as by etching, although it has been proposed ot leave a certain portion of this coating upon the transistor surface as a protection for portions thereof. The present invention provides, as integral steps in the manufacture of transistors, the control of the extent and position of semiconductor coating which serves the purpose of thereby delineating the exact lateral configuration of materials diffused into the semiconducting material and furthermore to provide a subsequent protection for the transistor surface. In accordance with the present invention it is possible not only to limit the extent of impurities diffusion in a semiconductor during the formation of different types of semiconductor, but furthermore, by the addition and subtraction of a masking layer or coating upon exposed transistor surfaces, it is herein possible to provide a precisely controlled area of any particular transistor material upon a common transistor surface. In addition, and in accordance with the present invention, there is herein provided, by the retention of a protective coating upon exposed transistor surfaces, means for preventing electrical shorting of transistor junctions and/or damage thereto during fabrication and manufacture of the transistor devices.

It is an object of the present invention to provide an improved method of manufacturing semiconductor devices wherein maximum surface protection of a device is afforded.

It is another object of the present invention to provide an improved method of manufacturing semiconductor devices wherein precise control is attained over lateral extent of diffused impurities therein.

It is a further object of the present invention to provide an improved method of transistor manufacture employing masking for controlling the extent of base surface area of minute double-diffused transistors.

It is yet another object of the present invention to provide a method of transistor manufacture including the addition of further masking to limit the diffusion of a second impurity in double-diffused transistors for maximizing the base surface area available for ohmic contacts, and additionally protecting transistor surfaces.

It is still another object of the present invention to provide an improved semiconducting device having a protective coating thereover except for ohmic contact areas.

It is a still further object of the present invention to provide an improved transistor structure having a laterally extended base surface for ohmic contact thereto, and including covered junction and exposed transistor surfaces.

Various other possible objects and advantages of the present invention will become apparent to those skilled in the art from the following description of the present invention. Although the invention is herein illustrated with respect to particular preferred embodiments thereof, no limitation is intended thereby, and reference is made to the appended claims for a precise delineation of the true scope of the present invention.

The present invention is particularly well adapted, insofar as the manufacture of semiconducting devices is concerned, to utilization with diode units as well as multi-element units. Although the problems encountered in the manufacture of high frequency triode transistors are normally more troublesome than those found in the art of diode manufacture, yet the present invention provides material advantage in the manufacture of diode semiconductors. Furthermore, although as previously noted, the present invention may be employed with a variety of semiconducting materials, yet actual use thereof has been primarily directed to silicon transistors and thus the following description is referenced thereto.

The invention is illustrated in the accompanying drawings wherein.

Figure 1:
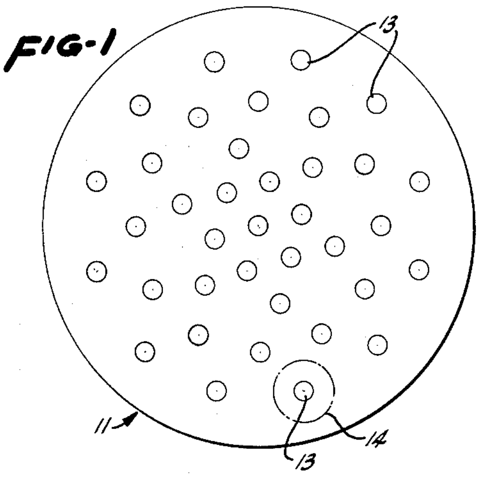
FIG. 1 is a plan view of a wafer of semiconducting material having the masking layer thereof removed within the illustrated circles.

Considering now the present invention as regards the method of transistor or semiconductor device manufacture, reference is made to FIGS. 1 to 4 wherein there is illustrated a diode semiconducting device at various stages of manufacture thereof in accordance with the present invention. There is illustrated in FIG. 1 a wafer 11 formed of a semiconducting material such as silicon having, for example, an N-type impurity therein. This wafer 11 has formed thereon as a step of the present invention, a coating 12 entirely covering the upper surface of the wafer. Preferably this coating is formed of a silicon oxide and various methods of producing such a layer are known in the art as, for example, by exposure of the silicon wafer to moisture and air, or by the utilization of an oxidizing agent such as hydrogen peroxide or the like. The oxide coating or layer 12 is formed into a mask by the production of a plurality of openings therethrough, and these openings are herein denominated by the numeral 13. The removal of the oxide layer within the illustrated circles or openings 13 may be accomplished by photoresist techniques or by etching as, for example, with hydrofluoric acid. Following the production of a masked wafer as illustrated in FIG. 1, the wafer may be cut into segments to form individual portions of separate diodes, although an alternative procedure is to form the diodes in a plurality upon the wafer 11 with a subsequent division of the wafer into separate diode units.

Figure 2:
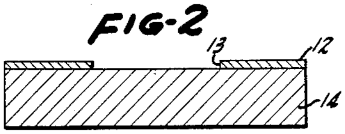
FIGS. 2, 3 and 4 are sectional views through a semiconducting diode device at separate stages of manufacture thereof in accordance with the present invention.

As herein illustrated, there is shown in FIG. 2 an individual minute wafer 14 cut from the large wafer 11, and having a mask 12 thereon, with a central aperture 13 therethrough exposing the upper surface of the wafer thereat. As a further step in the manufacture of the semiconductor diode, there is provided an impurity upon the upper surface of the wafer 14 within the aperture 13.

Figure 3:
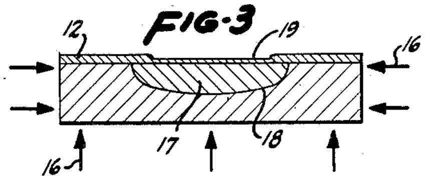
Figure 4:
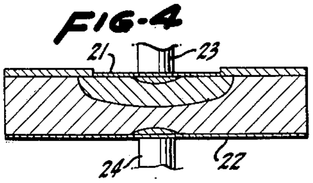
Figure 5:
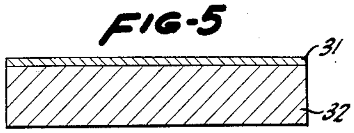
FIGS. 5, 6, 7, 8 and 9 are sectional views through a triode semiconducting device or transistor showing same at separate stages of manufacture in accordance with the present invention.

With an N-type silicon wafer, the impurity would be one of the known acceptor impurities preferably alloyed with silicon, and heat is added to the wafer and impurity, as indicated by the arrow 16. Application of sufficient heat to raise the wafer to an appropriate temperature results in a diffusion of the impurity applied into the wafer 14, so as to produce a region or portion 17 of P-type silicon within the wafer. Intermediate these two types of silicons now forming the wafer 14, there is produced a junction 18 in the well known manner whereat particular desired electrical characteristics are realized. During the diffusion of the impurities into the wafer of silicon 14, there is normally produced an oxidation of surface silicon so that, as indicated in FIG. 3, an oxide layer completely covers the top thereof.

In accordance with the present invention, the added oxide layer 19 within the masking aperture 13 is then removed as by etching with hydrofluoric acid or other suitable means so as to expose the upper surface of the P-type silicon material 17 with the junction between same and the N-type silicon being yet covered by the original masking layer 12. The diode device may then be completed by providing an ohmic contact 21 to the upper surface of the wafer within the aperture 13 and a similar contact 22 upon the underside of the wafer. These ohmic contacts may be conveniently applied by well known plating methods to deposit such as gold or the like upon the silicon, and electrical contacts or wires 23 and 24 are then attached to the device by alloying same to the ohmic contacts 21 and 22 and to the connecting silicon 17 at the top and 14 at the bottom. This alloying step is accomplished at a temperature in excess of the gold-silicon eutectic temperature of 373 degrees C. and serves the purpose of reducing electrical discontinuities at the connection. During the manufacture of the diode semiconducting device described above, the oxide layer formed upon the silicon is retained thereon at all times except at the surfaces to be employed in connection with ohmic contacts to the device. The resultant diode structure will be seen to be fully protected, particularly at the PN junction thereof, so as to prevent contamination and possible electrical leakage resulting from handling of the device and cleaning and canning of same during fabricating steps of the diode. It is of particular note that only within the original masking opening 13 is the oxide layer removed during diode manufacture, and at all other parts of the device there is provided an integral protective layer of silicon oxide.

Figure 6:
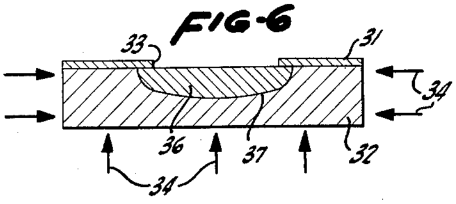

Considering now the improved method of the present invention as same relates to the manufacture of double-diffused silicon transistors, reference is made to FIGS. 5 to 9 of the drawing. As a first step in the manufacture there is produced a layer 31 formed, for example, of an oxide of silicon, and covering at least the upper surface of a silicon wafer 32, which may be formed of N-type silicon, for example. There is provided in this oxide layer 31 a hole or opening 33 which may be formed by photoresist techniques or by etching of the layer, and the configuration of the opening in the layer 31 is controlled to define the desired configuration of the transistor base member. The apertured layer 31 serves as a mask for protecting the transistor surface and junctions and for limiting the lateral diffusion of impurities in the wafer. The layer is thus formed of a material into which impurities to be employed during transistor manufacture will not diffuse during the steps thereof, and which not only tightly adheres to the wafer surface in protective relation thereto but which also is not electrically conducting. Upon the upper surface of the wafer 32 exposed at the aperture 33 in the mask or layer 31, there is disposed a predetermined amount of acceptor impurity, as in the form of a silicon alloy, and heat is applied, as indicated by the arrows 34, whereby the impurity diffuses into the wafer 32 to form a P-type base layer 36 therein. In conventional manner there is produced through controlled heating and cooling of the transistor structure, a transistor junction 37 between the base layer 36 and the wafer 32 with the upper terminus of this junction lying beneath the oxide mask 31, as illustrated in FIG. 6. As silicon technology is available in the literature, it is here only noted that N-type silicon may be formed by inclusion of an impurity chosen from group V of the periodic table, while P-type silicon may be formed by inclusion of an impurity from group III.

Figure 7:
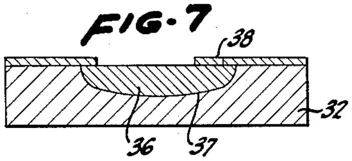
Figure 8:
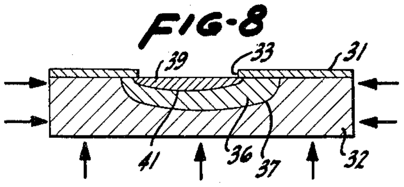
Figure 9:
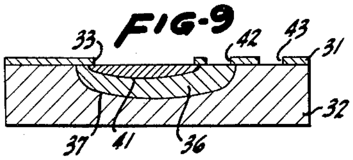

During or following disposition of the base layer 36 upon the wafer 32 and the formation of a transistor junction 37 therebetween, there is formed an additional or extensional portion of the oxide layer 31, as shown at 38 of FIG. 7. This additional masking 38 extends the oxide coating over an additional part of the base layer 36 to the end of masking same so that the second layer of material to be diffused into the transistor will not extend to both extremities of the base layer. With the augmented masking layer 31 upon the upper surface of the wafer 32 and in masking relation to some substantial portion of the base layer 36, there is diffused into the transistor structure a second layer 39 by the provision of a suitable impurity or alloy thereof atop the base layer and the addition of heat to raise the wafer and impurity upon same to diffusion temperature. In a conventional manner the diffusion of impurities into the wafer is precisely controlled as to rapidity and extent, so that there is thereby formed a second transistor junction 41 between an emitter layer 39 and the base layer 36. As may be seen from FIG. 8 of the drawings, the emitter 39 diffuses into the base and the junction 41 therebetween terminates at the upper surface of the wafer beneath the mask 38 adjacent the opening of reduced size therein. It will be further appreciated from the structure illustrated in FIG. 8 that there then results an uneven disposition of the second diffused layer 39 in that same is offset from the center of the base layer 36. Particular advantage is derived from this relationship of the respective layers for, as illustrated in FIG. 9, there is then removed a portion of the masking layer 31 to form an opening 42 therethrough immediately above the portion of the base layer 36 extending laterally from the emitter 39. In this manner, there is provided a substantial contact area of the base layer 36 available at the upper surface of the transistor for attachment of an ohmic contact thereto. Please note in this respect that the mask 31 is not removed from the upper surface of the transistor above the emitter-base junction 41, but instead is retained thereat so as to protect this junction from inadvertent shorting or other damage during subsequent manufacturing and handling operations. Not only is this junction 41 covered at the above-noted points, but additionally it is wholly encased by the oxide layer 31 at all other points upon the upper surface of the wafer. Likewise, the base-collector junction 37 is fully covered by the oxide layer 31 atop the transistor. As a consequence of this structure, there is provided a materially improved transistor structure wherein inadvertent damage or shorting of the junctions thereof is wholly precluded. In a conventional manner there may then be applied ohmic contacts to the emitter, base and collector. In this respect it is herein possible to provide an ohmic contact to the collector at the upper surface thereof so as to produce a transistor having all contacts on the same side. This is herein accomplished by providing an additional opening 43 through the mask 31 in lateral separation from the base opening 42 and therefore unmasking a desired extent of the collector at the top thereof. Ohmic contacts 44, 46 and 47 are then applied in a relatively conventional manner to the separate portions of the transistor through the openings 33, 42 and 43. It is herein possible to employ conventional plating techniques to apply electrical conductors to the semiconductor. Inasmuch as the transistor junctions are entirely covered and protected upon the upper surface of the transistor, no possible eletcrical shorting or damage to junctions can result from plating or alloying processes.

It will of course be appreciated that the silicon oxide herein stated as comprising the masking layer 31 upon the transistor wafer 32 does not react with the impurity employed in the formation of different type semiconducting materials. In this respect particular care must be taken to exclude gallium as a suitable impurity from the group III elements that may be diffused into the silicon, for this particular element does react with silicon oxide and consequently the mask will not be effective to limit the lateral extent of the diffusion of the impurity. Substantially all of the impurities which are desirable for use as dopants or diffusing elements with silicon do not react with the oxide layer herein employed, and consequently the method of the present invention is only limited insofar as the element gallium is concerned.

It is further noted that in the process above described relating to the manufacture of a triode transistor of a double-diffused silicon type, any unavoidable production of an oxide layer upon the upper surface of the wafer at points wherein the same is not desired is followed by the removal of same. Thus, for example, following the production of the base layer 36 by diffusing the selected impurity into the wafer 32, there may result a thin oxide layer over the top of the base portion of the transistor and this layer is then removed, at least in part, as by etching or photoresist techniques.

Figure 10:
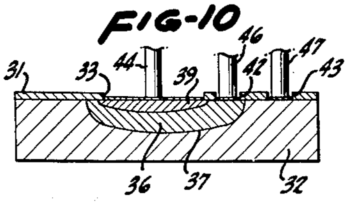
FIG. 10 is a sectional view through a transistor manufactured in accordance with the present invention.

Considering now the improved double-diffused silicon transistor of the present invention, reference is made to FIG. 10 of the drawing where there is illustrated in cross-section such a transistor. As may be seen from this this figure, the improved transistor includes a collector disc or wafer 32, formed for example, of an N-type silicon. At the top of this collector wafer 32 there is disposed a thin base layer 36, formed of silicon of opposite conductive type, thus in the present example of P-type silicon. Atop the base layer 36 there is provided an emitter layer or dot 39, of N-type silicon, and having a very minute dimension. Although not previously discussed, the present invention is particularly adapted to high frequency applications wherein very small dimensions are required of the transistor portions. Thus, in the present invention, the lateral extent of the emitter may be substantially less than one millimeter and the thickness of the base layer between emitter and collector may be of the order of one micron. Upon the upper surface of the wafer 32 there is provided the oxide layer or coating 31 which will be seen to fully cover both the emitter-base junction 41 and the base-collector junction 37. Openings 33, 42 and 43 through this oxide coating 31 provide communication with the emitter, base and collector, respectively, of the transistor whereby ohmic contacts may be made all in the upper plane of the transistor. Thus an ohmic contact including an electrical lead 44 is provided atop the emitter 39, while a second ohmic contact including a lead 46 is provided in connection with the upper surface of the base 36 through the masked openings 42. Likewise, a third ohmic contact 47 including an electrical conductor, is electrically and mechanically joined to the upper surface of the collector wafer 32 through the mask opening 43. The resulting transistor structure illustrated in FIG. 10 of the drawing will be seen to be particularly well adapted for high frequency applications, and furthermore to be fully protected from shorting of the junctions thereof as may otherwise occur during manufacture. While this transistor structure is well adapted to the provision of an ohmic contact to the collector thereof at the common upper surface of the transistor, yet the collector contact may also be provided upon the under surface of the wafer 32 as in the manner of the diode manufacture described above.

Although the above description of both the manufacturing process and the transistor structure has been referenced to an NPN transistor, it will be appreciated that it is equally applicable to PNP type transistors.

What is claimed is:

1. The method of making semiconductor devices, comprising the following steps:

(a) forming a non-conducting coating on a surface of a semiconductor body;

(b) opening a hole through said coating, thereby exposing a limited surface area of the semiconductor;

(c) diffusing into the semiconductor, through such hole, an impurity forming within the semiconductor, beneath the hole, a P-N junction extending to the semiconductor surface underneath said coating;

(d) re-forming a non-conducting coating on the semiconductor surface within such hole;

(e) and opening a new hole through the last-mentioned coating to the semiconductor surface, while leaving permanently in place the coating covering all parts of the P-N junction that extend to the semiconductor surface.

2. The method of making semiconductor devices, comprising the following steps:

(a) forming a non-conducting coating on a surface of a semiconductor body;

(b) opening a hole through said coating, thereby exposing a limited surface area of the semiconductor;

(c) diffusing into the semiconductor, through such hole, an impurity forming within the semiconductor, beneath the hole, a P-N junction extending to the semiconductor surface underneath said coating;

(d) re-forming a non-conducting coating on the semiconductor surface within the hole;

(e) opening a smaller hole through the last-mentioned coating to the semiconductor surface, while leaving in place the coating covering all parts of the previously formed P-N junction that extend to the semiconductor surface;

(f) diffusing into the semiconductor, through the smaller hole, an impurity forming, within the semiconductor between the previously formed junction and the surface, another P-N junction extending to the semiconductor surface underneath the reformed coating;

(g) and thereafter attaching contacts to the semiconductor while leaving permanently in place the coatings covering parts of the two P-N junctions that extend to the semiconductor surface.

3. The method of making double-diffused silicon transistors, comprising the following steps:

(a) providing a plane surface on a wafer of semiconductor silicon;

(b) forming an oxide of silicon layer entirely covering said plane surface;

(c) opening a hole through said oxide layer to the silicon surface;

(d) diffusing into the silicon, through such hole, an impurity that does not readily diffuse through the oxide layer, thereby forming a base layer of limited lateral extent within the silicon beneath the hole and a base-collector junction extending to the silicon surface underneath the oxide layer;

(e) while diffusing the base-layer impurity into the silicon as set forth in the preceding step (d), reforming an oxide of silicon layer on the silicon surface within the hole;

(f) opening a smaller hole through the last-mentioned oxide layer to the silicon surface, while leaving in place the oxide covering parts of the base-collector junction that extend to the silicon surface, such smaller hole being asymmetrically placed within the first-mentioned hole;

(g) diffusing into the silicon, through the smaller hole, another impurity that does not readily diffuse through the oxide layers, thereby forming an emitter layer of smaller lateral extent than the base layer and an emitter-base junction extending to the silicon surface underneath the oxide;

(h) attaching ohmic contacts to the base and emitter layers while leaving permanently in place the oxide covering the parts of the emitter-base junction and the base-collector junction that extend to the silicon surface.

4. A method of transistor manufacture comprising the steps of:

(a) oxidizing a surface of a wafer of crystalline semiconductor material containing a selected impurity to form an oxide coating thereon;

(b) forming at least one opening in said coating and thereby defining a mask exposing a limited surface of the material;

(c) controllably diffusing a selected impurity into said wafer at said mask opening and limiting the lateral extent thereof by said mask to form a first layer in said wafer;

(d) extending the oxide coating of said mask over a portion of said first layer;

(e) diffusing a different selected impurity into said wafer atop said first layer and limiting the lateral extent thereof by said extended mask to form a second layer with a transistor junction between same and said first layer;

(f) and removing a portion of said extended mask over said first layer to expose a portion thereof while retaining the extended mask over the transistor junction between said first and second layers.

5. A method of manufacturing double-diffused silicon transistors comprising the steps of:

(a) forming an oxide coating upon a surface of a wafer of semiconducting silicon;

(b) forming an opening in said coating exposing a limited area of said wafer of a desired size of a base portion of the transistor;

(c) diffusing at an elevated temperature an impurity into said wafer through said opening in the oxide coating thereon to form a base layer portion of the transistor limited in lateral extent by the size of the opening in said oxide coating with a transistor junction formed beneath the coating;

(d) adding a further oxide coating extending from the aforementioned coating in covering relation to a portion of said base layer;

(e) removing from the remainder of said base layer such oxide coating as may be produced during the diffusion thereof into said wafer;

(f) diffusing at an elevated temperature an impurity into said base layer to form a transistor emitter with a base-emitter junction between said layers and terminating at the surface of said wafer beneath the oxide coating thereon;

(g) removing a portion of said added oxide coating to expose a part of said base portion of said transistor while retaining the base-emitter transistor junction covered with said coating;

(h) removing from a portion of the surface of said emitter such oxide coating as may be formed thereon during diffusion of the impurity into said wafer;

(i) and forming ohmic contacts to said emitter and base portions of said transistor through said oxide coating at the openings thereof and limited by the extent of such openings whereby transistor junctions are protected from damage and electrical shorting.

6. A method of transistor manufacture as claimed in claim 5 further characterized by the steps of:

(j) forming another opening in said oxide coating atop said wafer to expose a portion of the wafer surface outside of the transistor junction existing between the base layer and wafer and without exposing such transistor junction;

(k) and attaching an ohmic contact to said wafer at said further opening.

7. In a method of manufacturing transistors wherein different impurities are separately diffused into a semiconductor wafer to form transistor junctions therein, the steps of:

(a) forming upon a surface of a semiconductor wafer a protective adherent coating of a non-conducting material through which said impurities do not readily diffuse;

(b) forming at least one opening in said coating;

(c) diffusing a first impurity through said opening into said wafer;

(d) covering a portion of said opening after diffusion of said first impurity into said wafer with a further coating of said material to define a reduced opening therethrough;

(e) diffusing a second impurity into said wafer through said reduced opening, whereby diffusion of said second impurity is limited in lateral extent with respect to said coated surface to a substantially lesser area than that of said first impurity;

(f) and forming an opening through said further coating to expose only a part of the semiconductor containing the first diffused impurity whereby same is thereby available for attachment of an electrical contact.

8. A method of manufacturing transistors comprising:

(a) forming a non-conducting protective coating upon a surface of a semiconducting wafer;

(b) forming an opening in said coating;

(c) diffusing a selected impurity into said wafer through said opening to form a transistor junction within said wafer and simultaneously forming an added non-conducting protective coating covering said opening;

(d) forming an opening in said added coating in offset relation to the center of the original opening;

(e) diffusing another selected impurity into said layer through the opening in said added coating to form a second transistor junction between the first-mentioned junction and the wafer surface;

(f) and removing portions of said coatings to expose areas for attachment of ohmic contacts to the semiconducting wafer while retaining all transistor junctions entirely covered by said coatings.

9. An improved method of manufacturing semiconductor devices comprising the steps of:

(a) forming a protective adherent mask upon the surface of a semiconductor;

(b) forming an opening of limited area in said mask at a predetermined location on a first surface of said semiconductor;

(c) controllably diffusing a selected impurity into said semiconductor through the opening in said mask while protecting the remainder of the surface by the mask whereby two zones of different conductivity are formed in the semiconductor with a rectifying junction therebetween, said junction extending to said first surface beneath said mask;

(d) re-forming a protective adherent mask upon the semiconductor surface within said opening;

(e) forming separate openings through the first-mentioned mask and the re-formed mask to said two zones at said first surface; and (f) attaching ohmic contacts to said two zones through said separate openings, said junction remaining entirely covered by said mask at all times.

10. An improved method of manufacturing semiconductor devices comprising the steps of:

(a) forming, upon the surface of a wafer of semiconducting material, a protective integral coating having an opening therethrough;

(b) diffusing impurities into said wafer through said opening in the mask to form within the semiconducting material zones of different conductivity separated by a rectifying junction extending to said first surface of the wafer beneath said coating;

(c) forming an additional, protective, integral coating upon the surface of said wafer within said opening;

(d) forming separate openings through the first-mentioned coating and the additional coating to each of said zones at said first surface while retaining the coating over said junction;

(e) and affixing ohmic contacts to said separate zones at said first wafer surface through said separate openings.

11. The method of making semiconductor devices, comprising the following steps:

(a) providing a semiconductor body with a coating on a surface thereof having a hole extending therethrough exposing a limited surface of the semiconductor;

(b) diffusing into the semiconductor, through such hole, an impurity forming within the semiconductor, beneath the hole, a P-N junction extending to the semiconductor surface underneath said coating;

(c) forming a non-conducting coating on the semiconductor surface within such hole;

(d) and opening a new hole through the last-mentioned coating to the semiconductor surface, while leaving permanently in place the coating covering all parts of the P-N junction that extend to the semiconductor surface.

References Cited in the file of this patent

UNITED STATES PATENTS

| | | |
|---|---|---|
| 2,653,374 | Mathews et al. | Sept. 29, 1953 |
| 2,680,220 | Starr et al. | June 11, 1954 |
| 2,695,852 | Sparks | Nov. 30, 1954 |
| 2,697,269 | Fuller | Dec. 21, 1954 |
| 2,796,562 | Ellis et al. | June 18, 1957 |
| 2,862,160 | Ross | Nov. 25, 1958 |
| 2,866,140 | Jones et al. | Dec. 23, 1958 |